(12) United States Patent
Taguchi et al.

(10) Patent No.: US 6,645,852 B1
(45) Date of Patent: Nov. 11, 2003

(54) PROCESS FOR FABRICATING A SEMICONDUCTOR DEVICE HAVING RECESS PORTION

(75) Inventors: Mitsuru Taguchi, Tokyo (JP); Shingo Kadomura, Kanagawa (JP); Miyata Koji, Mie (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/688,794

(22) Filed: Oct. 17, 2000

(30) Foreign Application Priority Data

Oct. 18, 1999 (JP) .......................................... 11-295199

(51) Int. Cl.[7] .......................................... H01L 21/4763
(52) U.S. Cl. ...................... 438/637; 438/687; 438/722; 438/906; 438/974
(58) Field of Search ................................ 438/637, 687, 438/722, 906, 974, FOR 347

(56) References Cited

U.S. PATENT DOCUMENTS

| | | | |
|---|---|---|---|
| 6,046,108 A | * | 4/2000 | Liu et al. |
| 6,090,699 A | * | 7/2000 | Aoyama et al. |
| 6,150,270 A | * | 11/2000 | Matsuda et al. |
| 6,169,036 B1 | * | 1/2001 | Bhowmik et al. |
| 6,177,364 B1 | * | 1/2001 | Huang |
| 6,284,149 B1 | * | 9/2001 | Li et al. |
| 6,297,147 B1 | * | 10/2001 | Yang et al. |

FOREIGN PATENT DOCUMENTS

JP        2000332020 A  * 11/2000

* cited by examiner

Primary Examiner—George Fourson
Assistant Examiner—Michelle Estrada
(74) Attorney, Agent, or Firm—Rader, Fishman & Grauer PLLC; Ronald P. Kananen

(57) ABSTRACT

A process for fabricating a semiconductor device, which comprises forming a recess portion in an insulating film covering a wiring made of copper or a copper alloy so that the recess portion reaches the wiring, wherein, after forming the recess portion, a plasma treatment using a gas containing hydrogen gas and nitrogen gas is conducted in a state such that the wiring is exposed through the bottom portion of the recess portion, or a plasma treatment using a gas containing hydrogen gas is conducted in a state such that the wiring is exposed through the bottom portion of the recess portion while cooling a substrate on which the wiring is formed. By the process of the present invention, a problem of redeposition of copper on the sidewall of a via hole in the argon sputtering and a problem of an etching process of the organic insulating film in the hydrogen plasma treatment can be solved, thus realizing excellent cleaning of the bottom portion of the via hole.

6 Claims, 3 Drawing Sheets

PROCESS FOR FABRICATING A SEMICONDUCTOR DEVICE HAVING RECESS PORTION

BACKGROUND OF THE INVENTION

1. Field of the Invention

The present invention relates to a process for fabricating a semiconductor device having a via hole. More particularly, the present invention is concerned with a process for fabricating a semiconductor device including a step of cleaning the via hole.

2. Prior Art

In accordance with an increasing demand for very large scale integrated-circuits (VLSI) having an even smaller size and exhibiting a higher speed, developments of wiring materials having a lower resistivity and interlayer dielectrics having a lower dielectric constant have been demanded. For meeting such demands, copper is studied as a substitute for an aluminum alloy which has conventionally been used as a wiring material, and various low dielectric-constant materials are studied as a substitute for silicon oxide which has conventionally been used as an interlayer dielectric.

Generally, copper is difficult to be dry etched. Therefore, as a process for forming a copper wiring, a so-called Damascene process is considered to be promising.

On the other hand, as a low dielectric-constant organic film, an organic insulating film, such as a polyaryl ether film, is considered to be promising.

An example of a copper multilayer wiring formed by the Damascene process is described below with reference to FIG. 2. As shown in FIG. 2, a lower-layer copper wiring 112 having a trench wiring structure is formed in an insulating film 111 which is formed on a substrate (not shown), and then, an interlayer dielectric 113 is formed on the insulating film 111 so as to cover the lower-layer copper wiring 112. Then, a via hole 115 is formed by the known process so as to reach both of a trench 114 for forming an upper-layer copper wiring in the interlayer dielectric 113 and the lower-layer copper wiring 112.

Subsequently, for achieving an excellent electrical connection between the upper-layer copper wiring to be formed and the above lower-layer copper wiring 112, an oxide film or the like which is formed on the surface of the lower-layer copper wiring 112 exposed though the bottom portion of the via hole 115 is removed by a cleaning process by means of an argon sputtering process. This argon sputtering process is conducted so that a 25 to 30 nm-thick film is sputtered, in terms of the thickness of a silicon oxide film.

Then, a barrier layer 116 is formed from, for example, tantalum nitride, on the inner surface of each of the above trench 114 and the via hole 115 by the sputtering process. In this instance, also on the interlayer dielectric 113, a barrier layer (not shown) is excessively formed. Further, a copper seed layer (not shown) is formed on the surface of the barrier layer 116, and then, both of the via hole 115 and the trench 114 are plugged with copper by an electroplating process. In this instance, also on the interlayer dielectric 113, copper is excessively deposited. Then, the excess copper and the excess barrier layer on the interlayer dielectric 113 are removed by a chemical mechanical polishing process, and copper is allowed to remain in the trench 114 and the via hole 115 through the barrier layer 116, thereby forming a plug 117 and an upper-layer copper wiring 118.

However, the cleaning process by means of the above-mentioned argon sputtering process is one that has been used for the conventional aluminum alloy wiring, and hence, in accordance with the advance of even finer wirings, it has become difficult to satisfactorily clean the bottom portion of the finer via hole by this cleaning process. In addition, in the case of the copper wiring, as shown in FIG. 3, the copper which is sputtered from the surface of the lower-layer copper wiring 112 exposed through the bottom portion of the via hole 115 is redeposited on the sidewall of the via hole 115, and a problem arises in that the resultant redeposited material 121 is diffused into the interlayer dielectric 113 to cause a leakage between the wirings.

Thus, in the copper wiring process, a hydrogen plasma process in which the oxide layer on the bottom portion of the via hole is removed utilizing a reduction reaction is a promising cleaning process. However, in this hydrogen plasma process, as shown in FIG. 4, when a part of the layer of the interlayer dielectric 113 is formed from organic insulating films 113a, 113b, the organic insulating films 113a, 113b are etched by a hydrogen plasma treatment, so that a problem occurs in that the sidewall portions of the via hole 115 and the trench 114 are receded. This problem is disclosed in "Proceedings of 1999 International Interconnect Technology Conference (1999), p. 198".

SUMMARY OF THE INVENTION

In this situation, the present inventors have made extensive and intensive studies with a view toward solving the above-mentioned problems accompanying the prior art, in connection with the process for fabricating a semiconductor device, which comprises forming a recess portion in an insulating film covering a wiring made of copper or a copper alloy so that the recess portion reaches the wiring. As a result, it has unexpectedly been found that the above-mentioned problems inevitably accompanying the conventional techniques can be solved by, after forming the recess portion, conducting a plasma treatment using a gas containing hydrogen gas and nitrogen gas in a state such that the wiring is exposed through the bottom portion of the recess portion, or conducting a plasma treatment using a gas containing hydrogen gas in a state such that the wiring is exposed through the bottom portion of the recess portion while cooling a substrate on which the wiring is formed. The present invention has been completed, based on the above novel finding.

Accordingly, it is an object of the present invention to provide a process for fabricating a semiconductor device, which is advantageous in that, even when the insulating film is formed from an organic insulating film, the compound of nitrogen and carbon dissociated from the resist or organic insulating material is deposited on and protects the sidewall of the recess portion, thus preventing the sidewall of the recess portion from being receded, and at the same time, the bottom portion of the recess portion can be cleaned well by a reduction effect by the hydrogen plasma treatment, thus making it possible to stably form a copper wiring having a low resistivity and high reliability.

It is another object of the present invention to provide a process for fabricating a semiconductor device, which is advantageous in that the activity of hydrogen radicals is lowered by conducting the plasma treatment at a low temperature, so that the etching effect of the hydrogen radicals on the sidewall of the recess portion can be remarkably suppressed, and therefore, the bottom portion of the recess portion can be cleaned well by a reduction effect by the hydrogen plasma treatment while preventing the sidewall of the recess portion from being receded, thus making it possible to stably form a copper wiring having a low resistivity and high reliability.

BRIEF DESCRIPTION OF THE DRAWINGS

The foregoing and other objects, features and advantages of the present invention will be apparent to those skilled in the art from the following description of the presently preferred exemplary embodiments of the invention taken in connection with the accompanying drawings, in which.

DETAILED DESCRIPTION OF THE PREFERRED EMBODIMENTS

Hereinbelow, one preferred embodiment of the process for fabricating a semiconductor device (first exemplified fabrication process) of the present invention will be described in detail with reference to FIGS. 1A and 1B, but the embodiment should not be construed as limiting the scope of the present invention.

Figure 1A:
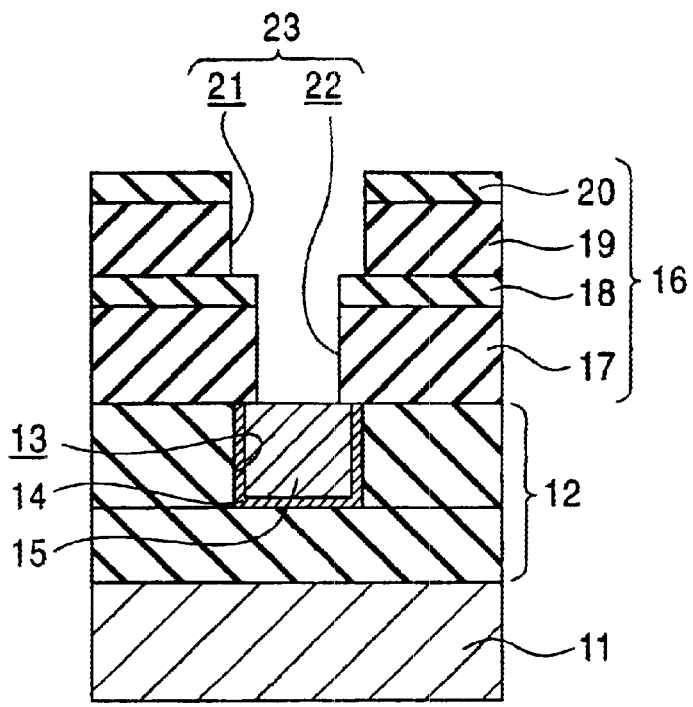
FIGS. 1A and 1B are diagrammatic cross-sectional views showing the process for fabricating a semiconductor device (first exemplified fabrication process and second exemplified fabrication process) according to the present invention.

As shown in FIG. 1A, a trench 13 is formed in an insulating film 12 which covers the semiconductor device, wiring and the like (not shown) formed on a substrate 11, and the trench 13 is plugged with a conductor material (e.g., copper) through a barrier layer 14, thereby forming a first wiring 15 having the so-called trench wiring structure. Then, an insulating film 16 is formed on the insulating film 12 so as to cover the first wiring 15 by, for example, successively laminating a low dielectric-constant organic film 17, a silicon oxide film 18, a low dielectric-constant organic film 19 and a silicon oxide film 20. As the above low dielectric-constant organic films 17, 19, for example, a polyaryl ether film is used.

Then, a trench 21 for forming an upper-layer copper wiring is formed in both of the silicon oxide film 20 and the low dielectric-constant organic film 19 in the insulating film 16 by the known process, and further, a via hole 22 is formed in both of the silicon oxide film 18 and the low dielectric-constant organic film 17 so that the via hole 22 reaches the first wiring 15, thereby constituting a recess portion 23. The above silicon oxide films 18, 20 serve as a so-called hard mask when the via hole 22 and the trench 21 are formed by an etching process.

Next, a plasma treatment using a gas containing hydrogen gas and nitrogen gas is conducted. In this plasma treatment, a Helicon-type plasma generator is used, and as a treatment gas, a mixed gas of hydrogen gas (at a flow rate of, for example, 100 cm$^3$/min) and nitrogen gas (at a flow rate of, for example, 100 cm$^3$/min) is used, and conditions for the treatment are, for example, such that the pressure of the atmosphere for the plasma treatment is 1 Pa, the bias power is 200 W, and the source power is 3 kW.

As another method which can obtain the same effect as that obtained by the above plasma treatment, there can be mentioned, for example, a method in which the Helicon-type plasma generator is used and, as a treatment gas, ammonia (NH$_3$) gas (at a flow rate of, for example, 200 cm$^3$/min) is used, and conditions for the treatment are, for example, such that the pressure of the atmosphere for the plasma treatment is 1 Pa, the bias power is 200 W, and the source power is 3 kW.

Figure 1B:
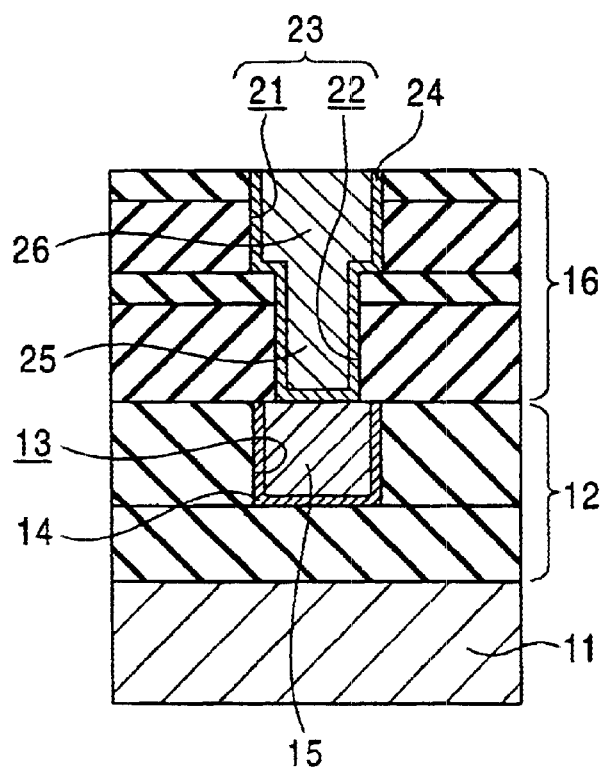
Figure 2:
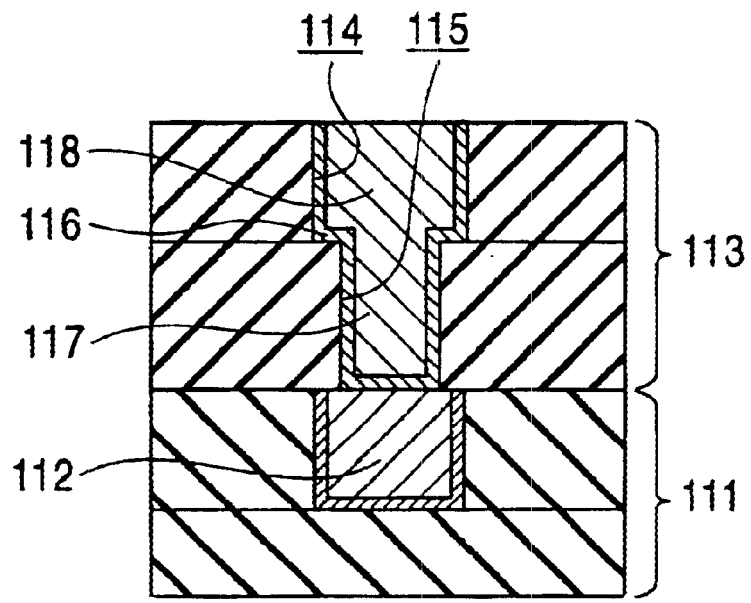
FIG. 2 is a diagrammatic cross-sectional view showing the conventional process for fabricating a semiconductor device.
Figure 3:
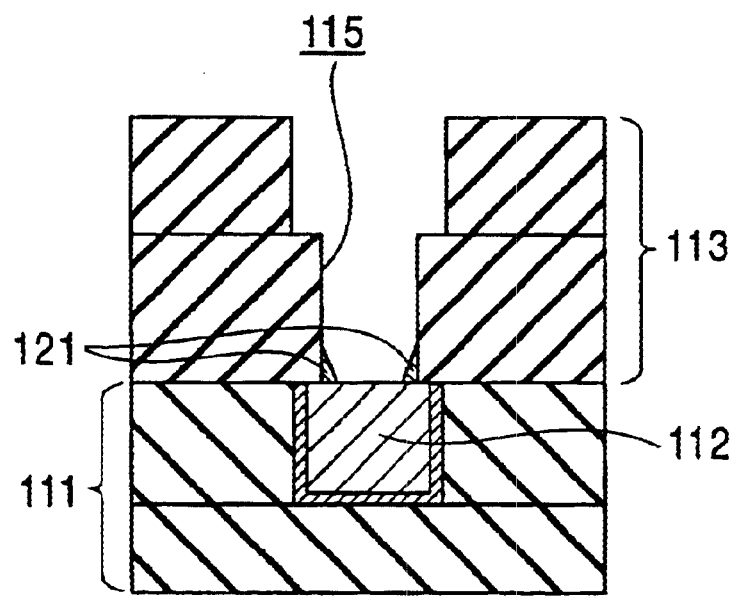
FIG. 3 is a diagrammatic explanatory cross-sectional view illustrating the problem of cleaning the bottom portion of a via hole by an argon sputtering process.
Figure 4:
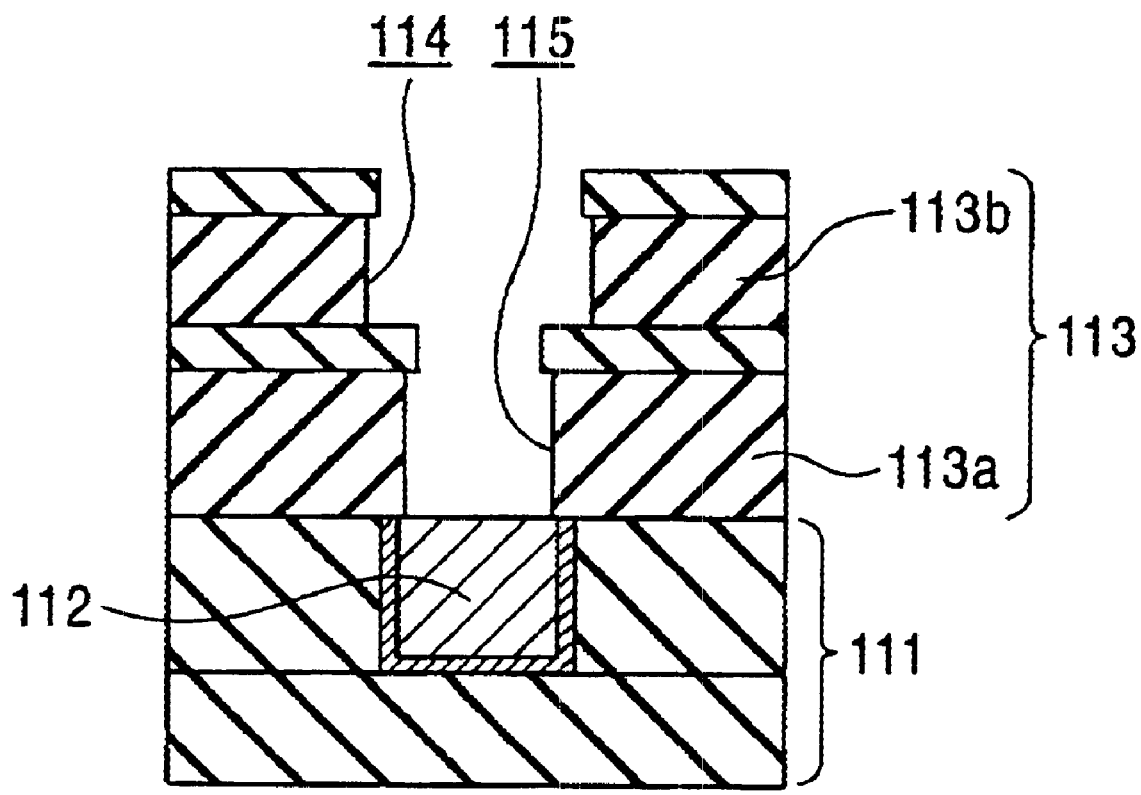
FIG. 4 is a diagrammatic explanatory cross-sectional view illustrating the problem of cleaning the bottom portion of a via hole by a hydrogen plasma treatment.

Then, as shown in FIG. 1B, a-barrier layer 24 is formed on the inner surface of each of the trench 21 and the via hole 22 by the sputtering process from, for example, tantalum nitride. In this instance, also on the insulating film 16 (silicon oxide film 20), a barrier layer (not shown) is excessively formed. In addition, a copper seed layer (not shown) is formed on the surface of the barrier layer 24, and then, each of the via hole 22 and the trench 21 is plugged with copper by an electroplating process. In this instance, also on the barrier layer 24 on the insulating film 16, copper is excessively deposited. Then, the excess copper and the excess barrier layer on the insulating film 16 are removed by a chemical mechanical polishing process and copper is allowed to remain in the trench 21 and the via hole 22 through the barrier layer 24, thereby forming a plug 25 and a second wiring 26.

For achieving more excellent electrical connection between the first wiring 15 and the plug 25, it is preferred that, before conducting the above-mentioned plasma treatment, contaminants, such as organic substances and the like, formed on the surface of the first wiring 15 exposed through the bottom portion of the via hole 22 are removed by an argon sputtering process. The argon sputtering process in this case is conducted for a period of time shorter than that of the conventional argon sputtering process so that the copper caused by sputtering of the surface of the first wiring 15 is not redeposited on the sidewall of the via hole 22. For example, it is desired that the argon sputtering process is conducted so that an about 10 nm-thick film is sputtered, in terms of the thickness of a silicon oxide film.

Further, the above argon sputtering process not only removes contaminants but also radiuses the opening portion of the trench 21 and the opening portion of the via hole 22. Due to the thus radiused opening portion, the copper plugging efficiency in the electroplating process is improved.

In the above-mentioned embodiment of the first fabrication process, an explanation is made on the cleaning process in the case where the recess portion is formed from the trench and the via hole formed in the bottom portion of the trench, but, also in the case where the recess portion is formed only from the via hole and the case where the recess portion is formed only from the trench, the above-described hydrogen plasma treatment conducted before forming the barrier layer is effective for removing the oxide film and contaminants on the bottom portion of the recess portion.

In the above first exemplified fabrication process, the insulating film 16 is formed from an organic insulating material, such as the low dielectric-constant organic film 17 and the low dielectric-constant organic film 19, but, by using a gas containing hydrogen gas and nitrogen gas as a gas for the plasma treatment, the compound of nitrogen and carbon dissociated from the resist or organic insulating material is deposited on and protects the sidewall of the recess portion 23. For this reason, the sidewall of the recess portion 23 is prevented from being receded. At the same time, the bottom portion of the recess portion 23 is cleaned well by a reduction effect by the hydrogen plasma treatment.

Further, in the above first exemplified fabrication process, by conducting the argon sputtering process before conducting the above-mentioned hydrogen plasma treatment, contaminants, such as organic substances and the like, deposited on the bottom portion of the via hole 22 can be more effectively removed, so that the cleaning effect can be improved, as compared to that in the case where the hydrogen plasma treatment is solely conducted.

Hereinbelow, one preferred embodiment of the process for fabricating a semiconductor device (second exemplified fabrication process) of the present invention will be described with reference to FIGS. 1A and 1B. In the below description in connection with the second exemplified fabrication process and the above description in connection with first exemplified fabrication process, like parts or portions are indicated by like reference numerals.

In the same manner as that described in the embodiment of the first exemplified fabrication process, a trench 13 is formed in an insulating film 12 which covers the semiconductor device, wiring and the like (not shown) formed on a substrate 11, and the trench 13 is plugged with a conductor material (e.g., copper) through a barrier layer 14, thereby forming a first wiring 15 having the so-called trench wiring structure. Then, an insulating film 16 is formed on the insulating film 12 so as to cover the first wiring 15 by, for example, successively laminating a low dielectric-constant organic film 17, a silicon oxide film 18, a low dielectric-constant organic film 19 and a silicon oxide film 20. As the above low dielectric-constant organic films 17, 19, for example, a polyaryl ether film is used.

Then, a trench 21 for forming an upper-layer copper wiring is formed in both of the silicon oxide film 20 and the low dielectric-constant organic film 19 in the insulating film 16 by the known process, and further, a via hole 22 is formed in both of the silicon oxide film 18 and the low dielectric-constant organic film 17 so that the via hole 22 reaches the first wiring 15, thereby constituting a recess portion 23. The above silicon oxide films 18, 20 serve as the so-called hard mask when the via hole 22 and the trench 21 are formed by the etching process.

Next, a plasma treatment using a gas containing hydrogen gas is conducted while cooling the substrate. In this plasma treatment, a Helicon-type plasma generator is used, and as a treatment gas, hydrogen gas (at a flow rate of, for example, 200 cm$^3$/min) is used, and conditions for the treatment are, for example, such that the substrate temperature is −50° C., the pressure of the atmosphere for the plasma treatment is 1 Pa, the bias power is 200 W, and the source power is 3 kW.

As another method which can obtain the same effect as that obtained by the above plasma treatment, there can be mentioned, for example, a method in which the Helicon-type plasma generator is used and, as a treatment gas, a mixed gas of hydrogen (H$_2$) gas and nitrogen (N$_2$) gas is used or ammonia (NH$_3$) gas is used, and conditions for the treatment are, for example, such that the substrate temperature is −50° C., the pressure of the atmosphere for the plasma treatment is 1 Pa, the bias power is 200 W. and the source power is 3 kW.

Then, a barrier layer 24 is formed on the inner surface of each of the trench 21 and the via hole 22 by sputtering from, for example, tantalum nitride. In this instance, also on the insulating film 16, a barrier layer (not shown) is excessively formed. In addition, a copper seed layer (not shown) is formed on the surface of the barrier layer 24, and then, each of the via hole 22 and the trench 21 is plugged with copper by an electroplating process. In this instance, also on the barrier layer 24 on the insulating film 16, copper is excessively deposited. Then, the excess copper and the excess barrier layer on the insulating film 16 are removed by a chemical mechanical polishing process and copper is allowed to remain in the trench 21 and the via hole 22 through the barrier layer 24, thereby forming a plug 25 and a second wiring 26.

For achieving more excellent electrical connection between the first wiring 15 and the plug 25, it is preferred that, before conducting the above-mentioned plasma treatment in the above second exemplified fabricating process, contaminants, such as organic substances and the like, formed on the surface of the first wiring 15 exposed through the bottom portion of the via hole 22 are removed by the argon sputtering process. The argon sputtering process in this case is conducted for a period of time shorter than that of the conventional argon sputtering process so that the copper caused by the sputtering process of the surface of the first wiring 15 is not redeposited on the sidewall of the via hole 22. For example, it is desired that the argon sputtering process is conducted so that an about 10 nm-thick film is sputtered, in terms of the thickness of a silicon oxide film.

Further, the above argon sputtering process not only removes contaminants but also radiuses the opening portion of the trench 21 and the opening portion of the via hole 22. Due to the thus radiused opening portion, the copper plugging efficiency in the electroplating process is improved.

In the above-mentioned embodiment of the second exemplified fabrication process, an explanation is made on the cleaning process in the case where the recess portion 23 is formed from the trench 21 and the via hole 22 formed in the bottom portion of the trench 21, but, also in the case where the recess portion is formed only from the via hole and the case where the recess portion is formed only from the trench, the above-described hydrogen plasma treatment conducted before forming the barrier layer is effective for removing the oxide film and contaminants on the bottom portion of the recess portion.

In the above second exemplified fabrication process, by conducting the plasma treatment process at a low temperature, the activity of hydrogen radicals is lowered, so that the etching effect of the hydrogen radicals on the sidewall of the recess portion 23, particularly on the sidewall of each of the low dielectric-constant organic films 17, 19 is remarkably suppressed. For this reason, almost no sidewall of the recess portion 23 is receded, so that the bottom portion of the recess portion 23 is cleaned well by a reduction effect by the hydrogen plasma treatment.

Further, in the above second exemplified fabrication process, by conducting the argon sputtering process before conducting the above-mentioned hydrogen plasma treatment, contaminants, such as organic substances and the like, deposited on the bottom portion of the via hole 22 can be more effectively removed, so that the cleaning effect can be improved, as compared to that in the case where the hydrogen plasma treatment is solely conducted.

In each of the above first and second fabrication processes, copper is used as a wiring material, but a copper alloy, such as copper zirconium, can also be used. Further, as the barrier layer, in addition to tantalum nitrate, tantalum, tantalum silicon nitride, tungsten, tungsten nitride, tungsten silicon nitride, titanium nitride and the like can also be used.

By the first exemplified fabrication process of the present invention, even when the insulating film is formed from an organic insulating film, the compound of nitrogen and carbon dissociated from the resist or organic insulating material is deposited on and protects the sidewall of the recess portion, thus preventing the sidewall of the recess portion from being receded. At the same time, the bottom portion of the recess portion can be cleaned well by a reduction effect by the hydrogen plasma treatment, thus making it possible to stably form a copper wiring having a low resistivity and high reliability.

In addition, by the second exemplified fabrication process of the present invention, the activity of hydrogen radicals is lowered by conducting the plasma treatment at a low temperature, so that the etching effect of the hydrogen radicals on the sidewall of the recess portion can be remarkably suppressed. Therefore, the bottom portion of the recess portion can be cleaned well by a reduction effect by the hydrogen plasma treatment while preventing the sidewall of the recess portion from being receded, thus making it possible to stably form a copper wiring having a low resistivity and high reliability.

What is claimed is:

1. In a process for fabricating a semiconductor device, which comprises forming a recess portion in an insulating film covering a wiring made of copper or a copper alloy so that said recess portion reaches said wiring, the process comprising, after forming said recess portion, conducting a plasma treatment using a gas containing hydrogen gas and nitrogen gas when said wiring is exposed through the bottom portion of said recess portion while cooling a substrate on which said wiring is formed, wherein said recess portion comprises a trench and a via hole.

2. The process according to claim 1, wherein, before conducting said plasma treatment, a sputtering process using argon gas is conducted.

3. In a process for fabricating a semiconductor device, which comprises forming a recess portion in an insulating film covering a wiring made of copper or a copper alloy so that said recess portion reaches said wiring, the process comprising, after forming said recess portion, conducting a plasma treatment using a gas containing hydrogen gas when said wiring is exposed through the bottom portion of said recess portion while cooling a substrate on which said wiring is formed, wherein said recess portion comprises a trench and a via hole.

4. The process according to claim 3, wherein, before conducting said plasma treatment, a sputtering process using argon gas is conducted.

5. In a process for fabricating a semiconductor device, which comprises forming a recess portion in an insulating film covering a wiring made of copper or a copper alloy so that said recess portion reaches said wiring, the process comprising, after forming said recess portion, conducting a plasma treatment using a gas containing ammonia ($NH_3$) gas when said wiring is exposed through the bottom portion of said recess portion while cooling a substrate on which said wiring is formed, wherein said recess portion comprises a trench and a via hole.

6. The process according to claim 5, wherein, before conducting said plasma treatment, a sputtering process using argon gas is conducted.

* * * * *